(12) United States Patent
Shiomi

(10) Patent No.: US 12,170,346 B2
(45) Date of Patent: Dec. 17, 2024

(54) DISPLAY DEVICE

(71) Applicant: SHARP KABUSHIKI KAISHA, Sakai (JP)

(72) Inventor: Makoto Shiomi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 419 days.

(21) Appl. No.: 17/783,811

(22) PCT Filed: Dec. 12, 2019

(86) PCT No.: PCT/JP2019/048697
§ 371 (c)(1),
(2) Date: Jun. 9, 2022

(87) PCT Pub. No.: WO2021/117189
PCT Pub. Date: Jun. 17, 2021

(65) Prior Publication Data
US 2023/0024146 A1    Jan. 26, 2023

(51) Int. Cl.
*H01L 33/50* (2010.01)
*H01L 27/15* (2006.01)
*H01L 33/62* (2010.01)

(52) U.S. Cl.
CPC .......... *H01L 33/505* (2013.01); *H01L 27/156* (2013.01); *H01L 33/62* (2013.01)

(58) Field of Classification Search
CPC ...... H01L 27/156; H01L 33/505; H01L 33/62
See application file for complete search history.

(56) References Cited

U.S. PATENT DOCUMENTS

2017/0278894 A1* 9/2017 Sato .................. H10K 59/38
2019/0185743 A1* 6/2019 Kim .................. G02F 1/133617
2021/0324263 A1* 10/2021 Kim ...................... C09K 11/70

FOREIGN PATENT DOCUMENTS

| CN | 108681153 A | 10/2018 |
|---|---|---|
| JP | 2016076327 A | 5/2016 |
| JP | 2019109515 A | 7/2019 |

* cited by examiner

*Primary Examiner* — Mark W Tornow
(74) *Attorney, Agent, or Firm* — ScienBiziP, P.C.

(57) ABSTRACT

A first pixel configured to emit light of a first color, a second pixel configured to emit light of a second color; and a third pixel configured to emit light of a third color are provided. The first pixel includes a first subpixel and a second subpixel each including a quantum dot light-emitting layer. A light-emission peak wavelength of the second subpixel is longer than a light-emission peak wavelength of the first subpixel.

20 Claims, 13 Drawing Sheets

(a)

| P1 NORMALIZED BRIGHTNESS | SP1 NORMALIZED BRIGHTNESS | SP2 NORMALIZED BRIGHTNESS | BLEND RATIO |
|---|---|---|---|
| 0% | 0% | 0% | — |
| 20% | 14% | 17% | 17/14 |
| 40% | 31% | 32% | 32/31 |
| 60% | 51% | 43% | 43/51 |
| 80% | 74% | 52% | 52/74 |
| 100% | 100% | 57% | 57/100 |

(b)

| P1 NORMALIZED BRIGHTNESS | P1 CHROMATICITY x | P1 CHROMATICITY y |
|---|---|---|
| 0% | 0.178 | 0.776 |
| 20% | 0.178 | 0.776 |
| 40% | 0.177 | 0.777 |
| 60% | 0.178 | 0.777 |
| 80% | 0.177 | 0.778 |
| 100% | 0.177 | 0.778 |

| P1 NORMALIZED BRIGHTNESS | SP1 NORMALIZED BRIGHTNESS | SP2 NORMALIZED BRIGHTNESS | BLEND RATIO | LIGHT AMOUNT RATIO |
|---|---|---|---|---|
| 0% | 0% | 0% | — | — |
| 20% | 5% | 41% | 41/5 | 82/15 |
| 40% | 18% | 70% | 70/18 | 70/27 |
| 60% | 40% | 87% | 87/40 | 29/20 |
| 80% | 66% | 96% | 96/66 | 32/33 |
| 100% | 96% | 100% | 100/96 | 25/36 |

DISPLAY DEVICE

TECHNICAL FIELD

The disclosure relates to a display device.

BACKGROUND ART

PTL 1 discloses a method of using, for a color filter, quantum dots that absorb excitation light and emit light of a longer wavelength than the excitation light.

CITATION LIST

Patent Literature

PTL 1: JP 2019-109515 A

SUMMARY

Technical Problem

In a case where a quantum dot light-emitting layer is provided to a subpixel of a display device, the following phenomenon was found to have occurred. Specifically, part of light emitted from the quantum dot light-emitting layer was self-absorbed in the quantum dot light-emitting layer, resulting in reemission of light. This phenomenon involves absorption on a short wavelength side and reemission on a long wavelength side, and thus causes a shift of the light-emission wavelength characteristics toward the long wavelength side, leading to color drift. This is particularly the case for high gray scale display.

Solution to Problem

A display device according to an aspect of the disclosure includes: a first pixel configured to emit light of a first color; a second pixel configured to emit light of a second color; and a third pixel configured to emit light of a third color. The first pixel includes a first subpixel and a second subpixel each including a quantum dot light-emitting layer, and a light-emission peak wavelength of the second subpixel is longer than a light-emission peak wavelength of the first subpixel.

Advantageous Effects of Disclosure

According to an aspect of the disclosure, color drift can be suppressed for a display device including a quantum dot light-emitting layer in each subpixel.

BRIEF DESCRIPTION OF DRAWINGS

FIG. 5(a) is a table showing normalized brightness of a first pixel, the first subpixel, and the second subpixel. FIG. 5(b) is a table showing chromaticity of the first pixel.

DESCRIPTION OF EMBODIMENTS

First Embodiment

Figure 1:
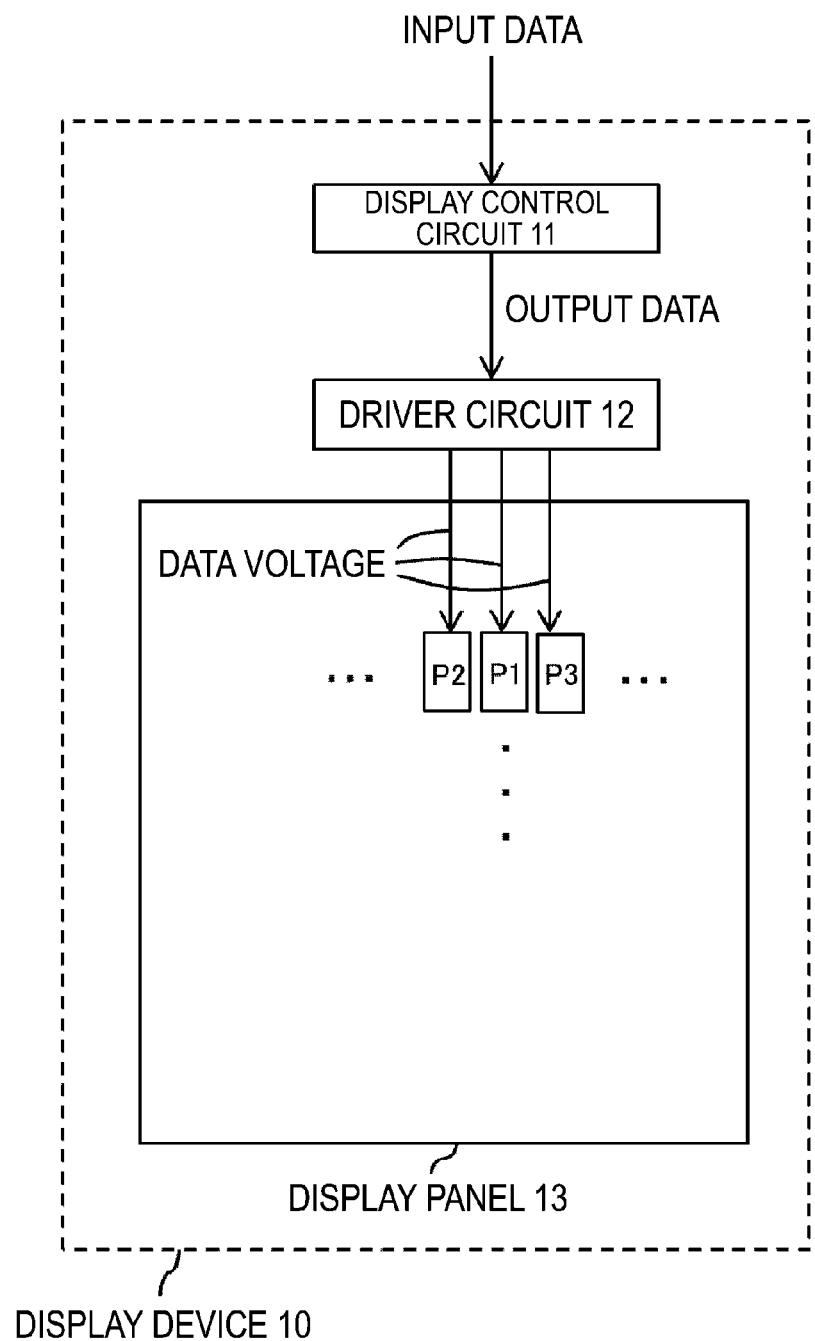
FIG. 1 is a block diagram illustrating a configuration of a display device according to a first embodiment.

FIG. 1 is a block diagram illustrating a configuration of a display device according to a first embodiment. FIG. 2(a) is a schematic plan view illustrating a subpixel array of the first embodiment. FIG. 2(b) is a cross-sectional view illustrating b-b cross section in FIG. 2(a). FIG. 2(c) is a cross-sectional view illustrating a c-c cross section in FIG. 2(a). As shown in FIG. 1, a display device 10 includes a display control circuit 11 and a display panel 13. The display panel 13 is provided with a plurality of pixels including a first pixel P1, a second pixel P2, and a third pixel P3, and a driver circuit 12 that drives these pixels.

The display control circuit 11 receives input data and generates output data. The driver circuit 12 receives the output data from the display control circuit 11, and generates data voltage (signal voltage) supplied to a plurality of pixels including the first pixel P1, the second pixel P2, and the third pixel P3.

Figure 2:
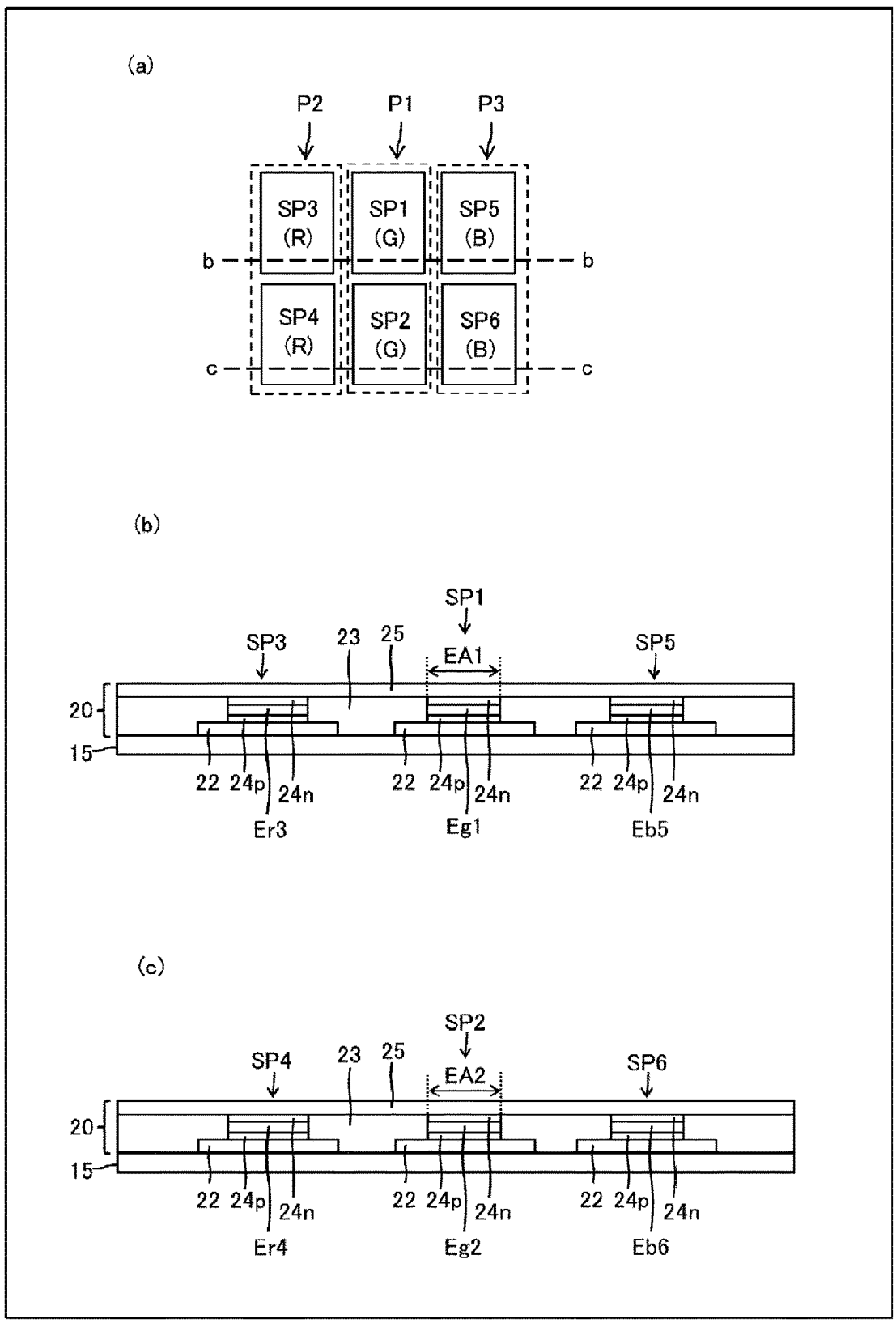
FIG. 2(a) is a schematic plan view illustrating a subpixel array of the first embodiment.
FIG. 2(b) is a cross-sectional view illustrating b-b cross section in FIG. 2(a).
FIG. 2(c) is a cross-sectional view illustrating a c-c cross section in FIG. 2(a).

As illustrated in FIG. 2, the display panel 13 includes a thin film transistor layer 15 and a light-emitting element layer 20. The light-emitting element layer 20 is provided with a pixel electrode 22 (anode), an edge cover film 23 that covers the edge of the pixel electrode 22, a hole transport layer 24p, quantum dot light-emitting layers Eg1 and Eg2 including quantum dots that emit light in a green range (from 500 nm to 560 nm), quantum dot light-emitting layers Er3 and Er4 including quantum dots that emit light in a red range (from 610 nm to 750 nm), quantum dot light-emitting layers Eb5 and Eb6 including quantum dots that emit light in a blue range (from 430 nm to 480 nm), an electron transport layer 24n, and a common electrode 25 (cathode), in this order from the lower layer side. The pixel electrode 22 is composed of layering of an indium tin oxide (ITO) and Ag (silver) or an alloy including Ag, and has light reflectivity, for example. The common electrode 25 is formed of a metal thin film of, for example, a magnesium silver alloy and has light transparency.

As illustrated in FIG. 2(a), the second pixel P2 that emits red (second color for example) light, the first pixel P1 that emits green (first color for example) light, and the third pixel P3 that emits blue (third color for example) light are arranged in this order in a row direction. The first pixel P1 includes a first subpixel SP1 and a second subpixel SP2 that are planarly arranged to be disposed side by side in a column direction. The second pixel P2 includes a third subpixel SP3 and a fourth subpixel SP4 that are planarly arranged to be disposed side by side in the column direction. The third pixel P3 includes a fifth subpixel SP5 and a sixth subpixel SP6 that are planarly arranged to be disposed side by side in the column direction.

As illustrated in FIG. 2(b) and FIG. 2(c), the first subpixel SP1 includes the quantum dot light-emitting layer Eg1. The second subpixel SP2 includes the quantum dot light-emitting layer Eg2. The third subpixel SP3 includes the quantum dot light-emitting layer Er3. The fourth subpixel SP4 includes the quantum dot light-emitting layer Er4. The fifth subpixel SP5 includes the quantum dot light-emitting layer Eb5. The sixth subpixel SP6 includes the quantum dot light-emitting layer Ebb.

The two pixel electrodes 22 in the two subpixels (SP1 and SP2 for example) of each pixel are preferably connected to different pixel circuits, but may be connected to a common pixel circuit.

In the first embodiment, the light-emission peak wavelength (537 nm, for example) of the second subpixel SP2 is longer than the light-emission peak wavelength (522 nm, for example) of the first subpixel SP1. The light-emission peak wavelength (690 nm, for example) of the fourth subpixel SP4 is longer than the light-emission peak wavelength (675 nm, for example) of the third subpixel SP3. The light-emission peak wavelength (465 nm, for example) of the sixth subpixel SP6 is longer than the light-emission peak wavelength (450 nm, for example) of the fifth subpixel SP5. In FIG. 2(a), the third subpixel SP3 (R), the first subpixel SP1 (G), and the fifth subpixel SP5 (B) are arranged in the row direction in this order. The fourth subpixel SP4 (R), the second subpixel SP2 (G), and the sixth subpixel SP6 (B) are arranged in the row direction in this order.

In the subpixels SP1 to SP6, holes and electrons recombine inside the quantum dot light-emitting layer in response to a drive current between the pixel electrode 22 and the common electrode 25, and light is emitted when the excitons generated in this manner transition from the conduction band of the quantum dot to the valence band.

Figure 3:
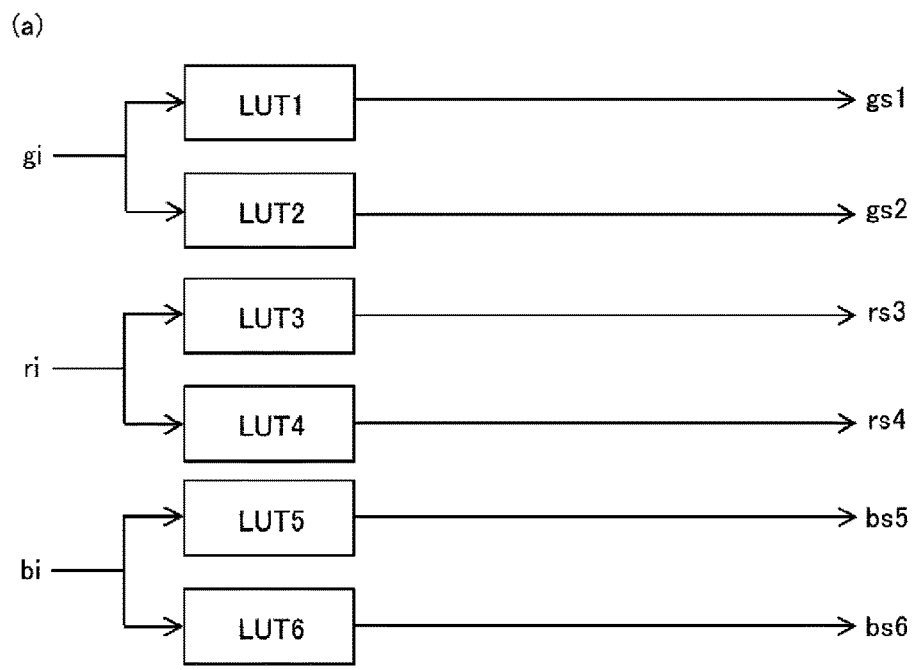
FIG. 3(a) is a block diagram illustrating steps of processing executed by the display control circuit according to the first embodiment.
FIG. 3(b) is a table showing an example of the steps of the processing (gray scale conversion).

FIG. 3(a) is a block diagram illustrating steps of processing executed by the display control circuit according to the first embodiment. FIG. 3(b) is a table showing an example of the steps of the processing. The display control circuit 11 uses image data gi corresponding to the first pixel P1 and lookup tables LUT1 and LUT2, to generate output data gs1 corresponding to the first subpixel SP1 and output data gs2 corresponding to the second subpixel SP2. As shown in FIG. 3(b), in the lookup table LUT1, the gray scale indicated by input data gi and the gray scale indicated by the output data gs1 are associated with each other. In the lookup table LUT2 the gray scale indicated by the input data gi and the gray scale indicated by the output data gs2 are associated with each other. For example, when the minimum gray scale value is 0 and the gray scale value of the input data gi is 511, the gray scale value of the output data gs1 is 511, and the gray scale value of the output data gs2 is 445. When the gray scale value of the input data gi is 1023 (maximum gray scale value), the gray scale value of the output data gs1 is 1023, and the gray scale value of the output data gs2 is 923.

The display control circuit 11 uses image data ri corresponding to the second pixel P2 and lookup tables LUT3 and LUT4, to generate output data rs3 corresponding to the third subpixel SP3 and output data rs4 corresponding to the fourth subpixel SP4, and uses image data bi corresponding to the third pixel P3 and lookup tables LUT5 and LUTE, to generate output data bs5 corresponding to the fifth subpixel SP5 and output data bs6 corresponding to the sixth subpixel SP6.

Figure 4:
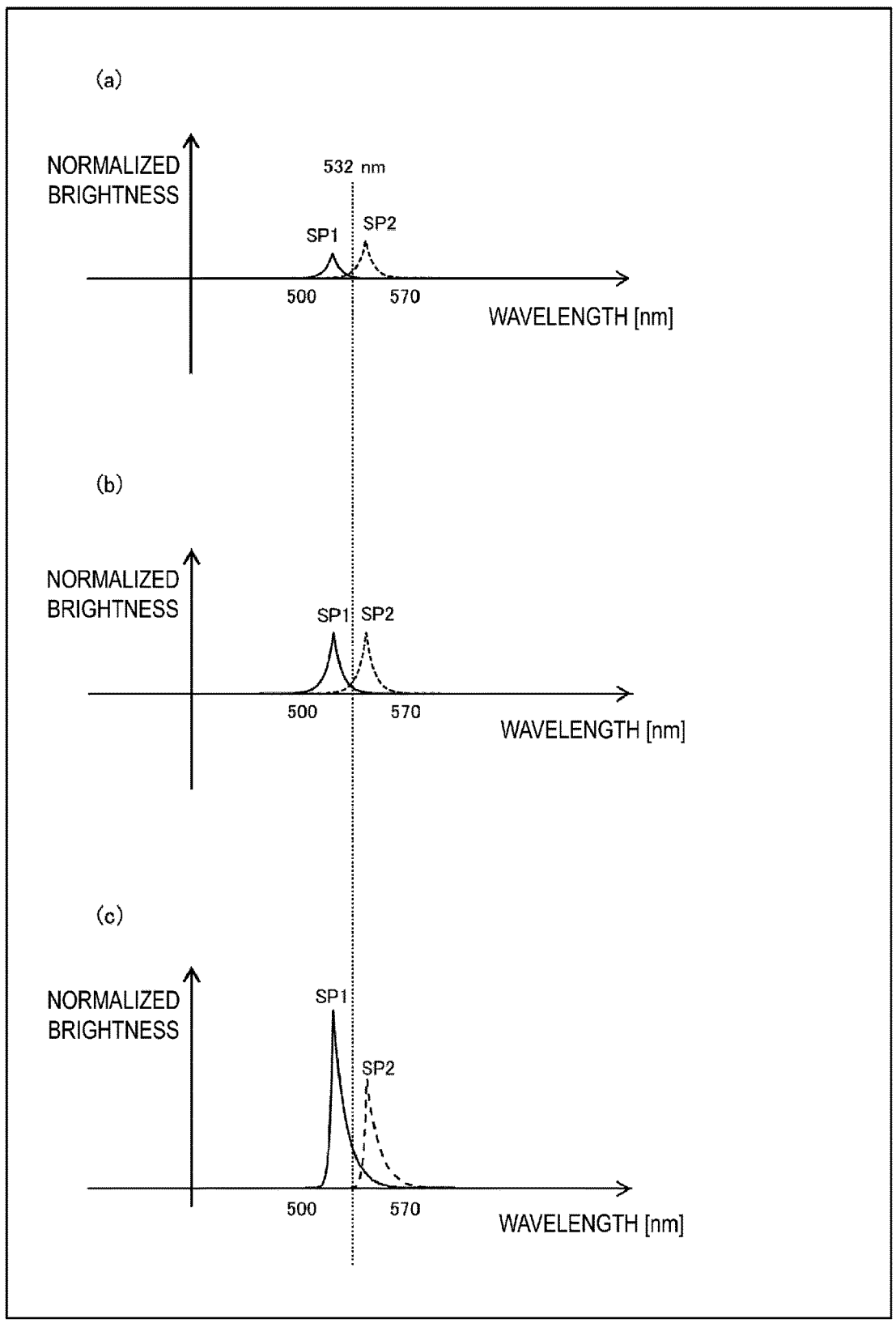
FIG. 4 is a graph showing light-emission profiles of a first subpixel and a second subpixel.

FIG. 4 is a graph showing light-emission profiles of the first subpixel and the second subpixel. FIG. 5(a) is a table showing the normalized brightness of the first pixel, the first subpixel, and the second subpixel. FIG. 5(b) is a table showing the chromaticity of the first pixel. The normalized brightness of the first pixel P1, the first subpixel SP1, and the second subpixel SP2 is a value indicating the ratio with respect to the maximum brightness (100%=gray scale value 1023). As illustrated in FIG. 2(b), the area of a light-emitting region EA2 of the second subpixel SP2 is the same as the area of a light-emitting region EA1 of the first subpixel SP1, and the ratio of the maximum brightness of the second subpixel SP2 to the maximum brightness of the first subpixel SP1 is 1.

In the first embodiment, display with the first pixel P1 is implemented by the light emission of the first subpixel SP1 and the light emission of the second subpixel SP2. Since different light-emission profiles of the first subpixel SP1 and the second subpixel SP2 partially overlap, the light-emission profile of the first pixel P1 has twin peaks as shown in FIG. 4. In FIG. 5(a), the ratio of the brightness of the second subpixel SP2 to the brightness of the first subpixel SP1 (hereinafter, blend ratio) is set based on the normalized brightness of the first pixel P1 (corresponding to the gray scale value of the input data gi).

Specifically, a smaller blend ratio is set for a higher normalized brightness of the first pixel P1 (the gray scale value of the input data gi). For example, the blend ratio is set to 17/14 when the normalized brightness of the first pixel P1 is 20% (see FIG. 4(a)), the blend ratio is set to 32/31 when the normalized brightness of the first pixel P1 is 40% (see FIG. 4(b)), the blend ratio is set to 52/74 when the normalized brightness of the first pixel P1 is 80%, and the blend ratio is set to 57/100 when the normalized brightness of the first pixel P1 is 100% (maximum gray scale) (see FIG. 4(c)).

As illustrated in FIG. 11(a), in a case where a green pixel is configured using one quantum dot light-emitting layer (in a case of a single peak), the light-emission profile is shifted toward the long wavelength side in a high gray scale region, due to the self-absorption by the quantum dot light-emitting layer (the absorption on the short wavelength side, and reemission on the long wavelength side), resulting in a marked change in color tone as illustrated in FIG. 11(b).

Figure 6:
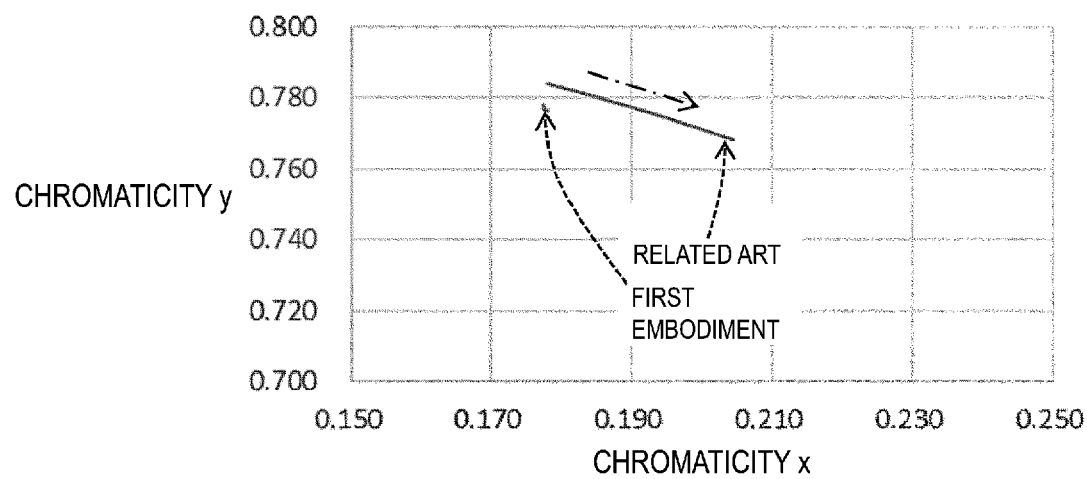
FIG. 6 is a table showing an effect of the first embodiment.

FIG. 6 is a table showing an effect of the first embodiment. With the first pixel P1 (green pixel) is formed using the two quantum dot light-emitting layers Eg1 and Eg2 with different light-emission peak wavelengths as in the first embodiment, a change in greenish color tone in the high gray scale region can be prevented as shown in FIG. 5(b) and FIG. 6. In the first embodiment, the normalized brightness of the second subpixel SP2 is kept to 57% or less, and thus the shift in the light-emission profile of the second subpixel SP2 alone can be made small.

A difference in the light-emission peak wavelength between the quantum dot light-emitting layers Eg1 and Eg2 is set to from 8 nm to 60 nm (preferably, from 15 nm to 40 nm), because the blending effect (the effect of suppressing the change in color tone) is compromised if such a difference is too large or too small. A larger difference (from 40 to 60 nm) in the light-emission peak wavelength leads to lower color purity, and thus is preferable for applications where a smaller change in color tone is prioritized over the color purity.

The self-absorption in the quantum dot light-emitting layer involves self-absorption on the short wavelength side and reemission on the long wavelength side. In view of this, in the case of the single peak configuration, with the light-emission peak wavelength (obtained for the green pixel of the display device) set as the target peak wavelength, the difference between the light-emission peak wavelength of the first subpixel SP1 and the target peak wavelength is set to be larger than the difference between the target peak wavelength and the light-emission peak wavelength of the second subpixel SP2 (preferably by about 1.5 times to 2.5 times), under a condition that the light-emission peak wavelength of the first subpixel SP1 (522 nm, for example)<the target peak wavelength (532 nm, for example)<the light-emission peak wavelength (537 nm, for example) of the second subpixel SP2 holds.

For example, the SP1 and SP2 light-emission profiles can be set by setting the quantum dot diameter of the quantum dot light-emitting layer Eg2 of the second subpixel SP2 to be larger than the quantum dot diameter of the quantum dot light-emitting layer Eg1 of the first subpixel SP1. It is a matter of course that this should not be construed in a limiting sense, and the material of the quantum dots (for example semiconductor) may differ between SP1 and SP2.

In the first embodiment, the second pixel P2 (red pixel) is configured using the two quantum dot light-emitting layers (Er1 and Er2) with different light-emission peak wavelengths, and the blend ratio is set based on the gray scale of the input data ri, whereby a change in reddish color tone in the high gray scale region can be prevented. The third pixel P3 (blue pixel) is configured using the two quantum dot light-emitting layers (Eb1 and Eb2) with different light-emission peak wavelengths, and the blend ratio is set based on the gray scale of the input data bi, whereby a change in bluish color tone in the high gray scale region can be prevented.

In the first embodiment, a configuration (twin peak configuration) is employed in which each of the first pixel P1, the second pixel P2, and the third pixel P3 is provided with two quantum dot light-emitting layers with different light-emission peak wavelengths. However, this should not be construed in a limiting sense. One or two of the first pixel P1, the second pixel P2, and the third pixel P3 may be of a twin peak configuration provided with the two quantum dot light-emitting layers with different light-emission peak wavelengths, and the remaining pixel(s) may be of a single peak configuration. For example, when one of the three pixels (R, G, B) is set to have a twin peak configuration, the green pixel highly visible to people is preferably configured to be of the twin peak configuration.

Figure 7:
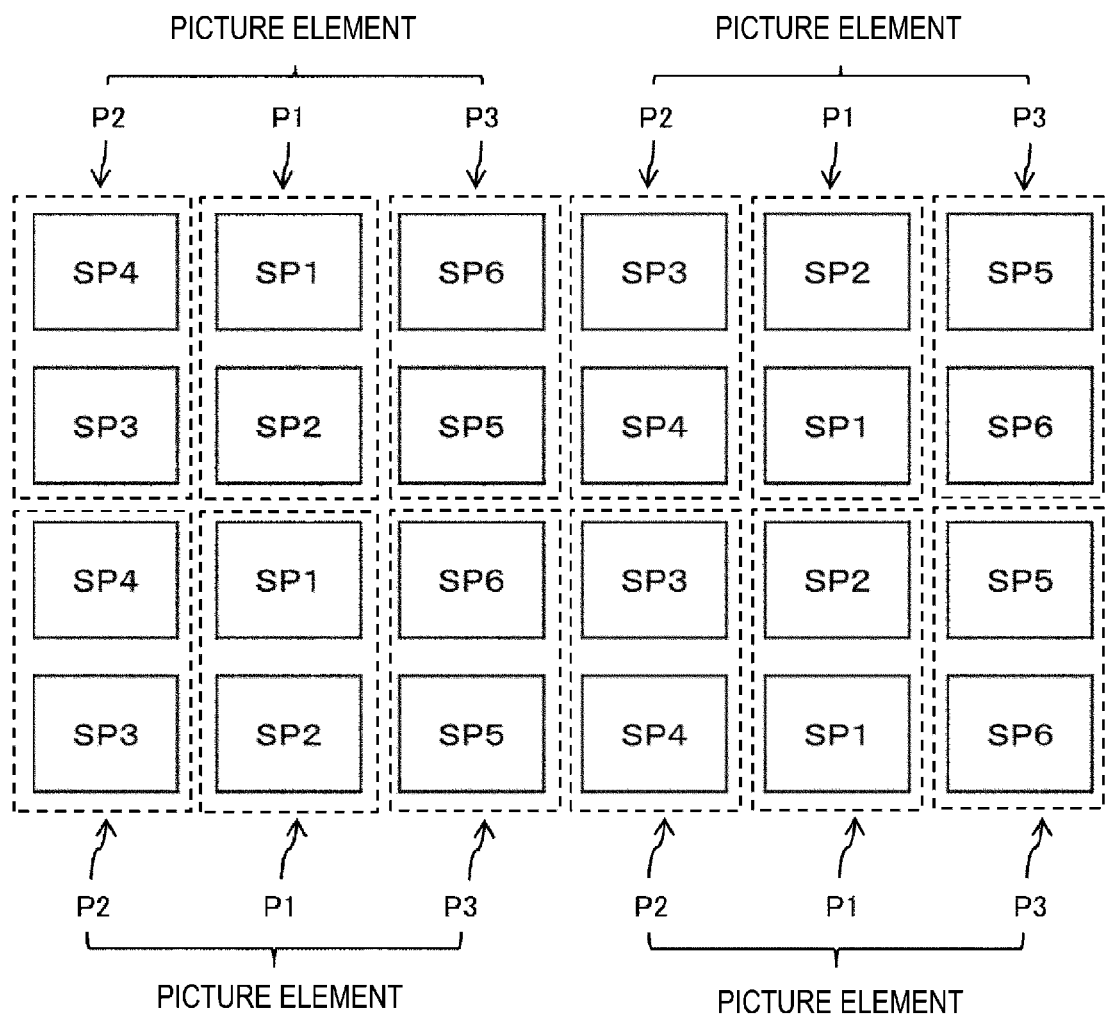
FIG. 7 is a schematic plan view illustrating another example of subpixel array (for four picture elements) according to the first embodiment.

FIG. 7 is a schematic plan view illustrating another example of subpixel array (for four picture elements) according to the first embodiment. In FIG. 7, the fourth subpixel SP4 (R), the first subpixel SP1 (G), and the sixth subpixel SP6 (B) are arranged in the row direction in this order. The third subpixel SP3 (R), the second subpixel SP2 (G), and the fifth subpixel SP5 (B) are arranged in the row direction in this order. A picture element is formed by the first pixel P1, the second pixel P2, and the third pixel P3. A row including the fourth subpixel SP4 (R), the first subpixel SP1 (G), and the sixth subpixel SP6 (B) in one of two picture elements adjacent to each other in the row direction, and a row including the third subpixel SP3 (R), the second subpixel SP2 (G), and the fifth subpixel SP5 (B) in the other one of the two picture elements, are adjacent to each other in the row direction. Also in FIG. 7, the peak wavelength of the first subpixel SP1 (G)<the peak wavelength of the second subpixel SP2 (G), the peak wavelength of the third subpixel SP3 (R)<the peak wavelength of the fourth subpixel SP4 (R), and the peak wavelength of the fifth subpixel SP5 (B)<the peak wavelength of the sixth subpixel SP6 (B) hold.

With the subpixels (SP1, SP3, SP5) on the short wavelength side and the subpixels (SP2, SP4, SP6) on the long wavelength side thus arranged in a staggered manner, display unevenness can be reduced.

Figure 8:
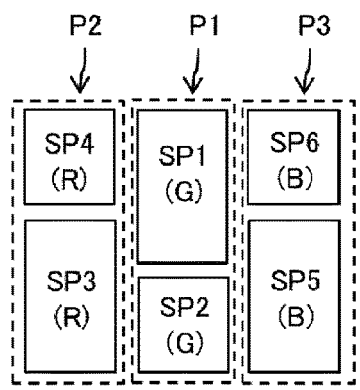
FIG. 8(a) is a schematic plan view illustrating another subpixel array according to the first embodiment.
FIG. 8(b) is a table illustrating normalized brightness of the first pixel, the first subpixel, and the second subpixel.

FIG. 8(a) is a schematic plan view illustrating another subpixel array according to the first embodiment. FIG. 8(b) is a table showing the normalized brightness of the first pixel, the first subpixel, and the second subpixel. In FIG. 8(a), the second pixel P2, the first pixel P1, and the third pixel P3 are arranged in this order in the row direction. The first pixel P1 includes the first subpixel SP1 and the second subpixel SP2 arranged in the column direction. The second pixel P2 includes the third subpixel SP3 and the fourth subpixel SP4 arranged in the column direction. The third pixel P3 includes the fifth subpixel SP5 and the sixth subpixel SP6 arranged in the column direction.

The area of the light-emitting region of the second subpixel SP2 is smaller than the area of the light-emitting region of the first subpixel SP1. The area of the light-emitting region of the fourth subpixel SP4 is smaller than the area of the light-emitting region of the third subpixel SP3. The area of the light-emitting region of the sixth subpixel SP6 is smaller than the area of the light-emitting region of the fifth subpixel SP5. The first subpixel SP1 and the third subpixel SP3 are diagonally arranged. The second subpixel SP2 and the fourth subpixel SP4 are diagonally arranged. The first subpixel SP1 and the fifth subpixel SP5 are diagonally arranged. The second subpixel SP2 and the sixth subpixel SP6 are diagonally arranged.

In FIG. 8(a), the area of the light-emitting region of the second subpixel SP2 is ⅔ of the area of the light-emitting region of the first subpixel SP1. The ratio of the maximum light amount (in a case of normalized brightness 100%) of the second subpixel SP2 to the maximum light amount (in a case of normalized brightness 100%) of the first subpixel SP1 is ⅔. In FIG. 8(b), the blend ratio and the light amount ratio of the second subpixel SP2 decrease as the normalized brightness (the gray scale of the input data gi) of the first pixel P1 increases. With the area of the light-emitting region of the second subpixel SP2 set to be larger than the area of the light-emitting region of the first subpixel SP1 and with up to approximately 100% of normalized brightness of the second subpixel SP2 used as described above, the first pixel P1 can have a higher brightness (dynamic range) or a smaller pixel area.

For the sake of efficient use of both the first subpixel SP1 and the second subpixel SP2, the area of the light-emitting region of the first subpixel SP1 is preferably not smaller than 1.5 times and not larger than 2 times the area of the light-emitting region of the second subpixel SP2.

Figure 9:
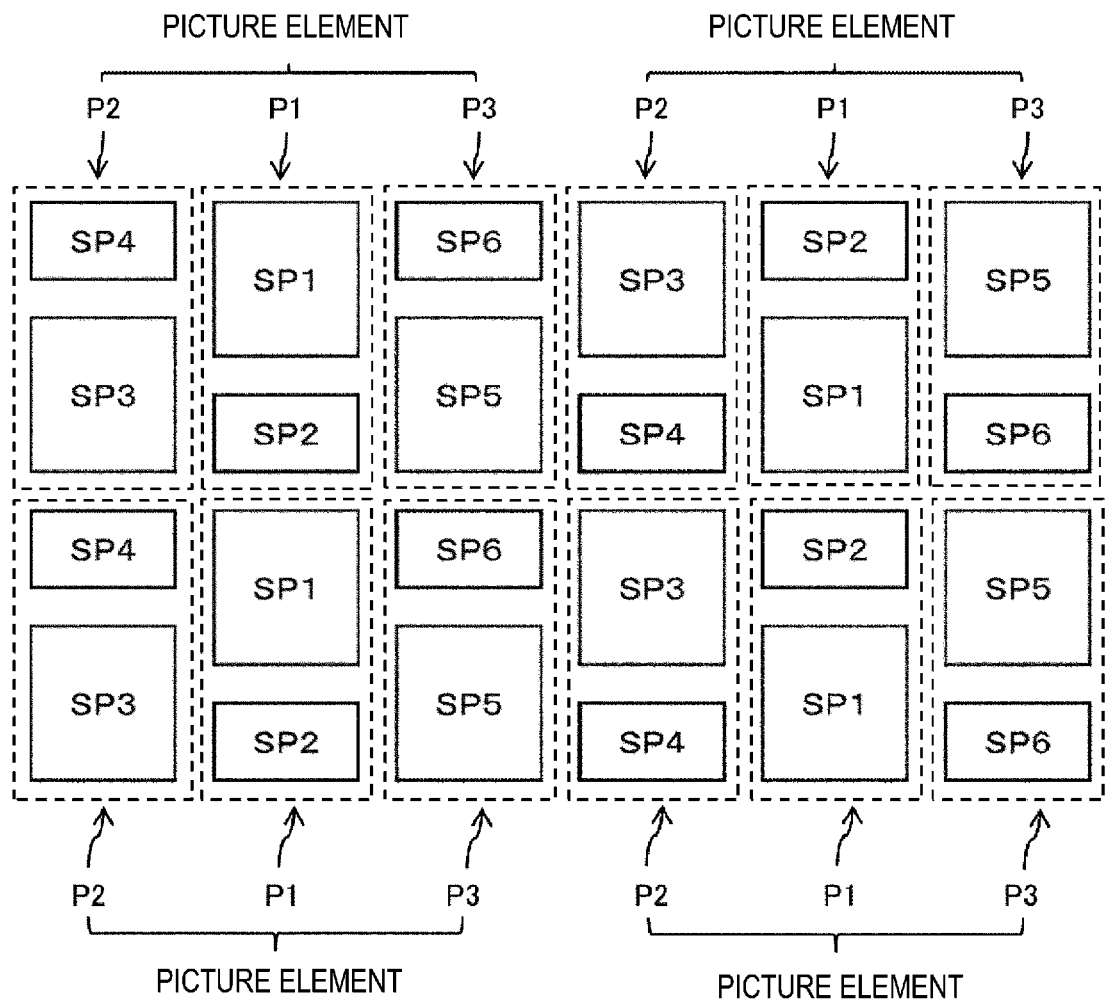
FIG. 9 is a schematic plan view illustrating a modification (for four picture elements) of the subpixel configuration in FIG. 8(a).

FIG. 9 is a schematic plan view illustrating a modification (for four picture elements) of the subpixel configuration in FIG. 8(a). In FIG. 9, the area of the light-emitting region of the second subpixel SP2 is ⅔ of the area of the light-emitting region of the first subpixel SP1. The area of the light-emitting region of the fourth subpixel SP4 is ⅔ of the area of the light-emitting region of the third subpixel SP3. The area of the light-emitting region of the sixth subpixel SP6 is ⅔ of the area of the light-emitting region of the fifth subpixel SP5. The peak wavelength of the first subpixel SP1 (G)<the peak wavelength of the second subpixel SP2 (G), the peak wavelength of the third subpixel SP3 (R)<the peak wavelength of the fourth subpixel SP4 (R), and the peak wavelength of the fifth subpixel SP5 (B)<the peak wavelength of the sixth subpixel SP6 (B) hold.

In FIG. 9, the fourth subpixel SP4 (R), the first subpixel SP1 (G), and the sixth subpixel SP6 (B) are arranged in the row direction in this order. The third subpixel SP3 (R), the second subpixel SP2 (G), and the fifth subpixel SP5 (B) are arranged in the row direction in this order. A row, including the fourth subpixel SP4 (R), the first subpixel SP1 (G), and the sixth subpixel SP6 (B) in one of two picture elements adjacent to each other in the row direction, and a row including the third subpixel SP3 (R), the second subpixel SP2 (G), and the fifth subpixel SP5 (B) in the other one of the two picture elements, are adjacent to each other in the row direction.

With the subpixels (SP1, SP3, SP5) on the short wavelength side having a large area and the subpixels (SP2, SP4, SP6) on the long wavelength side having a small area thus arranged in a staggered manner, display unevenness can be reduced.

Second Embodiment

FIG. 10(a) is a schematic plan view illustrating a subpixel array of a second embodiment. FIG. 10(b) is a cross-sectional view illustrating b-b cross section in FIG. 10(a). In the second embodiment, the second pixel P2, the first pixel P1, and the third pixel P3 are arranged in this order in the row direction, and the first pixel P1 includes the first subpixel SP1 and the second subpixel SP2 arranged in a layered manner.

In FIG. 10(b), the pixel electrode 22, the hole transport layer 24p, the quantum dot light-emitting layer Eg2 including quantum dots emitting light in a green region (537 nm for example), the electron transport layer 24n, the common electrode 25, an electron transport layer 26n, the quantum dot light-emitting layer Eg1 including quantum dots emitting light in a green region (522 nm for example), a hole transport layer 26p, and a pixel electrode 28 are formed in this order on the thin film transistor layer 15.

The first subpixel SP1 includes the common electrode 25, the electron transport layer 26n, the quantum dot light-emitting layer Eg1, the hole transport layer 26p, and the pixel electrode 28. The second subpixel SP2 includes the pixel electrode 22, the hole transport layer 24p, the quantum dot light-emitting layer Eg2, the electron transport layer 24n, and the common electrode 25. The edge of the pixel electrode 22 is covered by a lower layer edge cover 23 (insulating film), the edge of the hole transport layer 26p is covered by an upper layer edge cover 27 (insulating film), and the pixel electrode 28 overlaps the entirety of the hole transport layer 26p.

The pixel electrode 28 functions as the anode of a light-emitting element of the first subpixel SP1. The pixel electrode 22 functions as the anode of a light-emitting element of the second subpixel SP2. The common electrode 25 functions as a common cathode for these light-emitting elements. The area of the light-emitting region EA1 of the first subpixel SP1 is the same as the area of the light-emitting region EA2 of the second subpixel SP2. The entirety of the light-emitting region EA2 of the second subpixel SP2 overlaps the light-emitting region EA1 of the first subpixel SP1.

The first pixel P1 has a top emission structure. The pixel electrode 22 has light reflectivity. The common electrode 25 and the pixel electrode 28 have light transparency. The first subpixel SP1 is disposed on the top side, and the second subpixel SP2 is disposed on the bottom side.

On the thin film transistor layer 15, a first pixel circuit PC1, a second pixel circuit PC2, and a power supply wiring line PW are formed. The pixel electrode 28 of the first subpixel SP1 is connected to the first pixel circuit PC1. The pixel electrode 22 of the second subpixel SP2 is connected to the second pixel circuit PC2. The common electrode 25 is connected to the power supply wiring line PW. In this case, different data signals are supplied to the first subpixel SP1 and the second subpixel SP2.

In the second embodiment, as shown in FIG. 5(a), by reducing the blend ratio of the second subpixel SP2 as the normalized brightness of the first pixel P1 (gray scale value of input data gi) increases, a change in greenish color tone in the high gray scale region can be prevented.

As illustrated in FIG. 10(b), in the first pixel P1 of the layered structure and of the top emission structure, a phenomenon in which the light from the quantum dot light-emitting layer that is the lower layer is absorbed by the quantum dot light-emitting layer that is the upper layer, and a phenomenon in which light from the quantum dot light-emitting layer that is the upper layer is absorbed by the quantum dot light-emitting layer that is the lower layer may occur. The former is more pronounced than the latter. Thus, the quantum dot light-emitting layer Eg2 with a long light-emission peak wavelength is disposed to be the lower layer, and the quantum dot light-emitting layer Eg1 with a short light-emission peak wavelength is disposed to be the upper layer, to suppress a change in the respective light-emission profiles of the first subpixel SP1 and the second subpixel SP2 due to interference therebetween.

Specifically, the light produced in the lower layer may be reflected, but will entirely pass through the upper layer to affect the upper layer. On the other hand, the light that is produced in the upper layer and travels upward (top direction) does not pass through the lower layer. Thus, at most, only 50% of the light that is produced in the upper layer affects the lower layer. Thus, with the light-emitting layer Eg1 with a short wavelength (a large impact) arranged to be an upper layer, a change in the light-emission profiles of both the light-emitting layers Eg1 and Eg2 is suppressed.

Similarly, the third subpixel SP3 including the quantum dot light-emitting layer Er3 and the fourth subpixel SP4 including the quantum dot light-emitting layer Er4 (Er4 light-emission peak wavelength>Er3 light-emission peak wavelength) are provided to form a layered structure (with Er4 being on the lower layer side) and the blend ratio of the fourth subpixel SP4 is reduced as the normalized brightness (gray scale value of the input data ri) of the second pixel P2 increases. Thus, a change in reddish color tone in the high gray scale region can be prevented.

Furthermore, the fifth subpixel SP5 including the quantum dot light-emitting layer Eb5 and the sixth subpixel SP6 including the quantum dot light-emitting layer Eb6 (Eb6 light-emission peak wavelength>Eb5 light-emission peak wavelength) are provided to form a layered structure (with Eb6 being on the lower layer side) and the blend ratio of the sixth subpixel SP6 is reduced as the normalized brightness (gray scale value of input data bi) of the third pixel P3 increases. Thus, a change in bluish color tone in the high gray scale region can be prevented.

Figure 10:
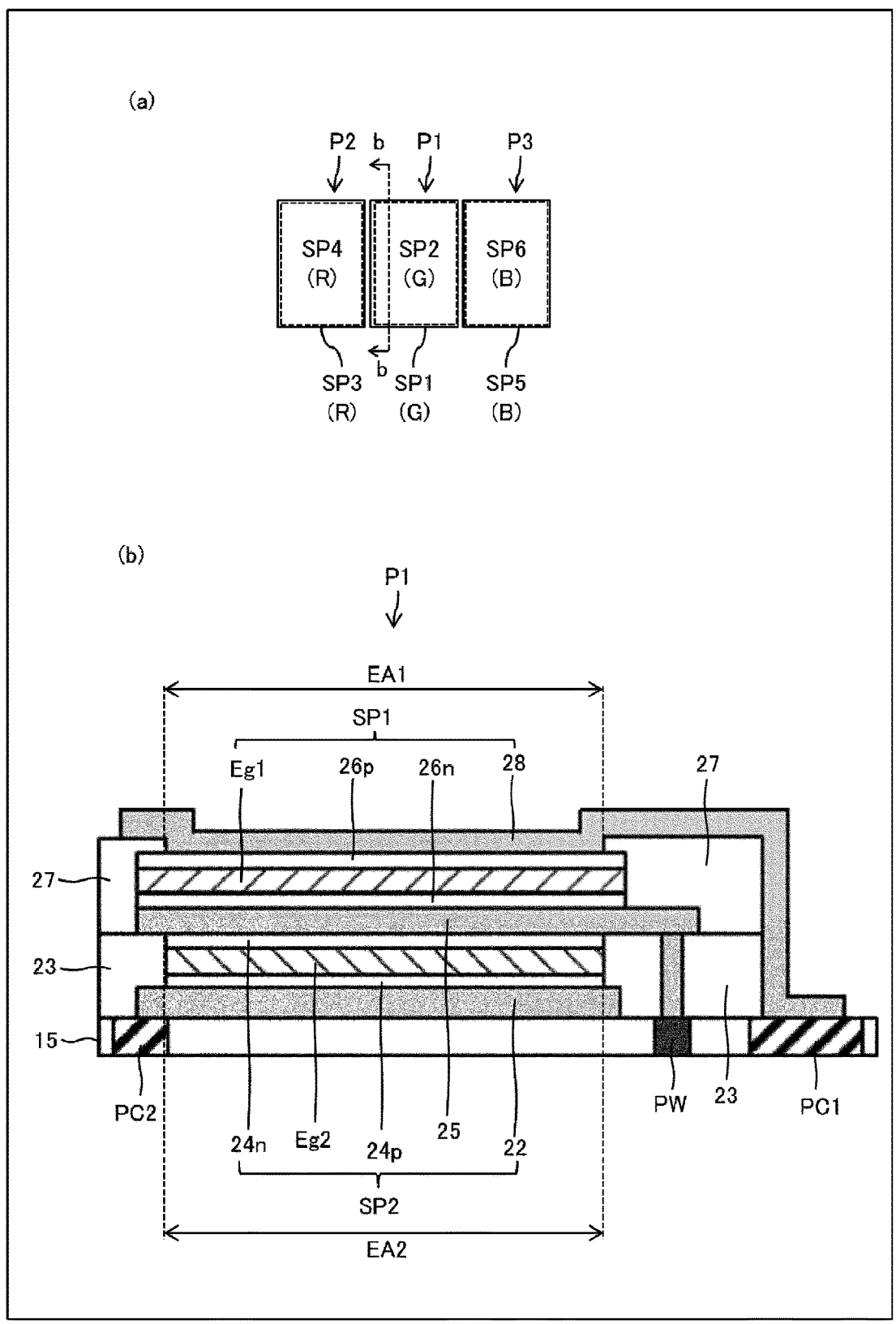
FIG. 10(a) is a schematic plan view illustrating a subpixel array of a second embodiment.
FIG. 10(b) is a cross-sectional view illustrating b-b cross section in FIG. 10(a).
Figure 11:
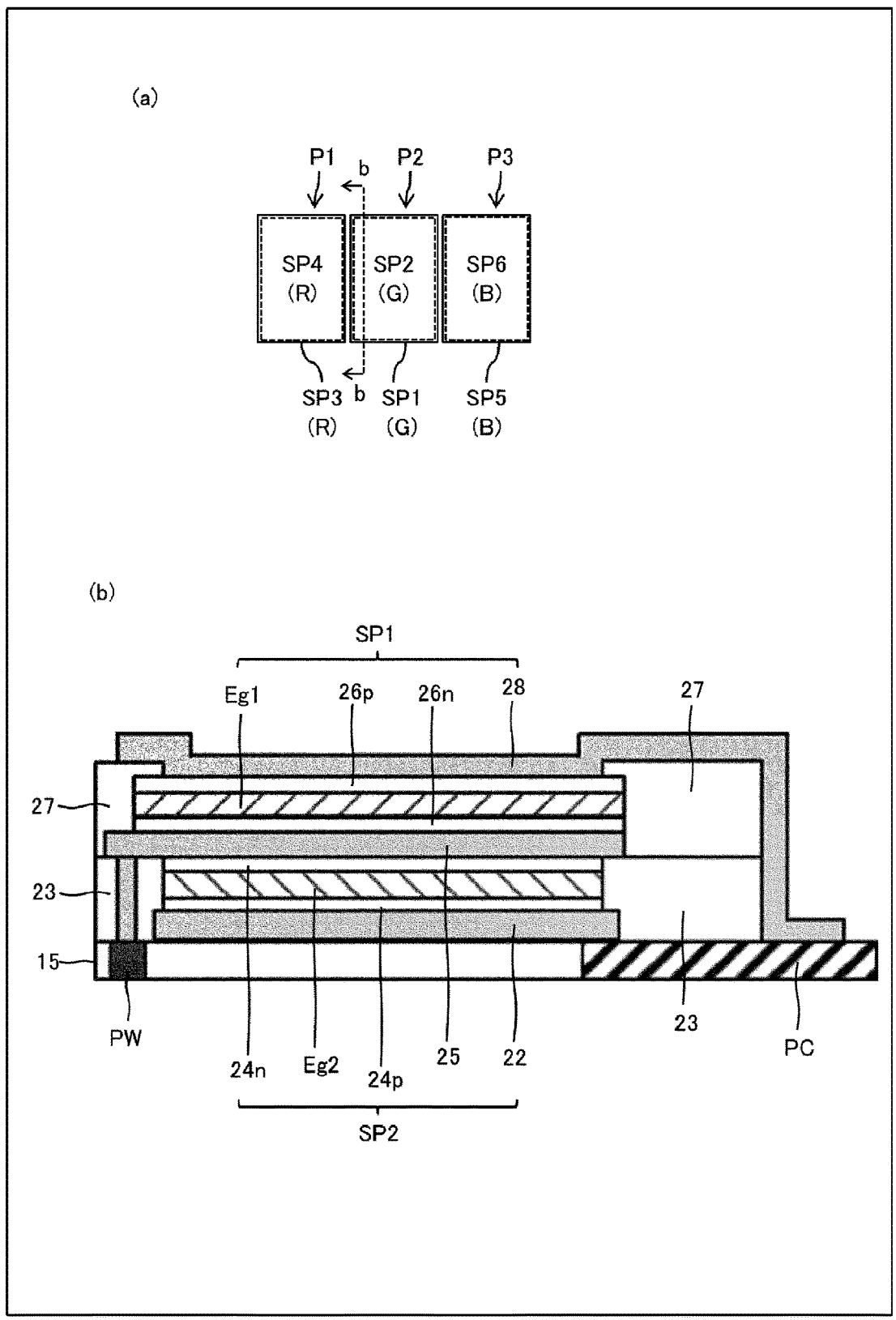
FIG. 11(a) is a schematic plan view illustrating another subpixel array of the second embodiment.
FIG. 11(b) is a cross-sectional view illustrating b-b cross section in FIG. 11(a).

FIG. 11(a) is a schematic plan view illustrating another subpixel array of the second embodiment. FIG. 11(b) is a cross-sectional view illustrating the b-b cross section in FIG. 11(a). In FIG. 10(b), the first subpixel SP1 and the second subpixel SP2 are connected to different pixel circuits, but this should not be construed in a limiting sense. As illustrated in FIG. 11, the pixel electrodes 28 of the first subpixel SP1 and the pixel electrodes 22 of the second subpixel SP2 may be connected to a common pixel circuit PC. In this case, to the first subpixel SP1 and the second subpixel SP2, the same data signal may be supplied at the same timing, or different data signals may be supplied at different timings.

Figure 12:
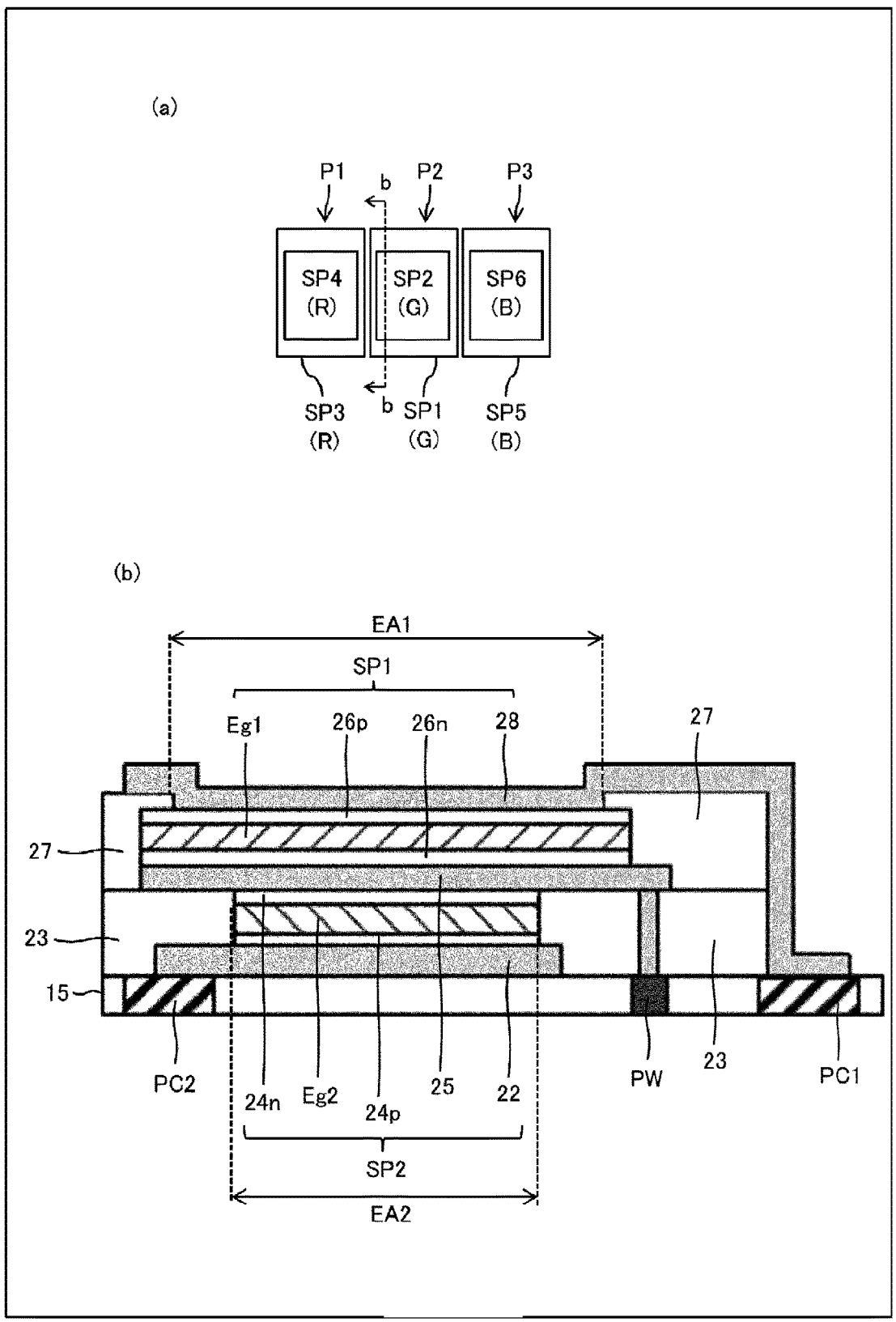
FIG. 12(a) is a schematic plan view illustrating still another subpixel array of the second embodiment.
FIG. 12(b) is a cross-sectional view illustrating b-b cross section in FIG. 12(a).
Figure 13:
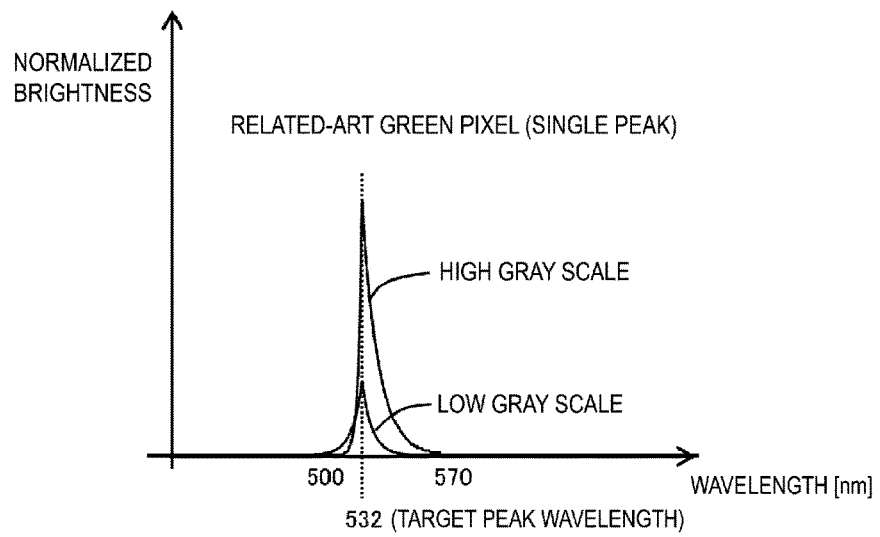
FIG. 13(a) is a graph showing a light-emission profile of a known green pixel.
FIG. 13(b) is a table showing a change in color tone of the known green pixel.

FIG. 12(a) is a schematic plan view illustrating still another subpixel array of the second embodiment. FIG. 12(b) is a cross-sectional view illustrating b-b cross section in FIG. 12(a). As illustrated in FIG. 12, a configuration may be employed in which the area of the light-emitting region EA2 of the second subpixel SP2 is smaller than the area of the light-emitting region EA1 of the first subpixel SP1, and the entirety of the light-emitting region EA2 of the second subpixel SP2 overlaps the light-emitting region EA1 of the first subpixel SP1. For example, the normalized brightness of the first subpixel SP1 and the second subpixel SP2 are set as in FIG. 7(b), under the condition EA2=EA1×(⅔). With this configuration, the amount of light from the quantum dot light-emitting layer Eg2 absorbed by the quantum dot light-emitting layer Eg1 is reduced, whereby the color tone (blend ratio) can be highly accurately set with respect to the input data gi (gray scale).

The configuration of the second embodiment illustrated in FIG. 10 with the area of the light-emitting region EA2 of the second subpixel SP2 being large, enabling high pixel brightness (wide dynamic range) despite rough color tone setting, is suitable for consumer use television sets or the like. The configuration illustrated in FIG. 12 with the area of the light-emitting region EA2 of the second subpixel SP2 being small, enabling highly accurate color tone setting is suitable for professional monitors or the like.

In the second embodiment, a configuration (twin peak configuration) is employed in which each of the first pixel P1, the second pixel P2, and the third pixel P3 has two quantum dot light-emitting layers with different light-emission peak wavelengths layered. However, this should not be construed in a limiting sense. One or two of the first pixel P1, the second pixel P2, and the third pixel P3 may be of the twin peak configuration with the two quantum dot light-emitting layers with different light-emission peak wavelengths layered, and the remaining pixel(s) may be of the single peak configuration.

The embodiments described above are for the purpose of illustration and description and are not intended to be limiting. It will be apparent to those skilled in the art that many variations will be possible in accordance with these examples and descriptions.

The invention claimed is:

1. A display device comprising:
a first pixel configured to emit light of a first color;
a second pixel configured to emit light of a second color; and
a third pixel configured to emit light of a third color,
wherein the first pixel includes a first subpixel and a second subpixel each including a quantum dot light-emitting layer, and
a light-emission peak wavelength of the second subpixel is longer than a light-emission peak wavelength of the first subpixel,
wherein a ratio of brightness of the second subpixel to brightness of the first subpixel in a case where a maximum gray scale is input to the first pixel is smaller than a ratio of the brightness of the second subpixel to the brightness of the first subpixel in a case where predetermined gray scale closer to a minimum gray scale than the maximum gray scale is input to the first pixel.

2. The display device according to claim 1,
wherein the first subpixel and the second subpixel are arranged to be layered with at least part of the first subpixel overlapping the second subpixel.

3. The display device according to claim 2,
wherein the first pixel is provided with a pixel electrode of the first subpixel, the quantum dot light-emitting layer of the first subpixel, a common electrode common to the first subpixel and the second subpixel, the quantum dot light-emitting layer of the second subpixel, and a pixel electrode of the second subpixel, from a bottom side, and
the pixel electrode of the first subpixel has light reflectivity, and the pixel electrode of the second subpixel and the common electrode have light transparency.

4. The display device according to claim 1,
wherein the first subpixel and the second subpixel are planarly arranged without overlapping.

5. The display device according to claim 1,
wherein an area of the light-emitting region of the second subpixel is equal to an area of the light-emitting region of the first subpixel.

6. The display device according to claim 1,
wherein an area of the light-emitting region of the second subpixel is smaller than an area of the light-emitting region of the first subpixel.

7. The display device according to claim 6,
wherein an area of the light-emitting region of the first subpixel is not smaller than 1.5 times and not larger than 2 times an area of the light-emitting region of the second subpixel.

8. The display device according to claim 1,
wherein a light-emission peak wavelength of the first subpixel is shorter than a target peak wavelength of the first pixel, and the light-emission peak wavelength of the second subpixel is longer than the target peak wavelength.

9. The display device according to claim 8,
wherein a difference between the light-emission peak wavelength of the first subpixel and the target peak wavelength is larger than a difference between the light-emission peak wavelength of the second subpixel and the target peak wavelength.

10. The display device according to claim 9,
wherein the difference between the light-emission peak wavelength of the first subpixel and the target peak wavelength of the first pixel is not smaller than 1.5 times and not larger than 2.5 times the difference between the light-emission peak wavelength of the second subpixel and the target peak wavelength of the first pixel.

11. The display device according to claim 1,
wherein a difference in the light-emission peak wavelength between the first subpixel and the second subpixel is not smaller than 10 (nm) and not larger than 60 (nm).

12. The display device according to claim 2,
wherein the first pixel has a top emission structure, and
the first subpixel is disposed on a top side, and the second subpixel is disposed on a bottom side.

13. The display device according to claim 1,
wherein the first color is any one of red, green, and blue.

14. The display device according to claim 1,
wherein a quantum dot diameter of the quantum dot light-emitting layer of the second subpixel is larger than a quantum dot diameter of the quantum dot light-emitting layer of the first subpixel.

15. The display device according to claim 1,
wherein the second pixel includes a third subpixel and a fourth subpixel, each including a quantum dot light-emitting layer,
the third pixel includes a fifth subpixel and a sixth subpixel, each including a quantum dot light-emitting layer,
a light-emission peak wavelength of the fourth subpixel is longer than a light-emission peak wavelength of the third subpixel, and
a light-emission peak wavelength of the sixth subpixel is longer than a light-emission peak wavelength of the fifth subpixel.

16. The display device according to claim 1,
wherein the first color is blue, the second color is green, and the third color is red.

17. The display device according to claim 1,
wherein a light-emission profile of the first subpixel and a light-emission profile of the second subpixel overlap.

18. The display device according to claim 1,
wherein the first color is green, the second color is red, and the third color is blue,
a light-emission profile of the first pixel includes two light-emission peak wavelengths,
a light-emission profile of the second pixel includes one light-emission peak wavelength, and
a light-emission profile of the third pixel includes one light-emission peak wavelength.

19. The display device according to claim 1,
wherein different data signals are supplied to the first subpixel and the second subpixel from different pixel circuits.

20. The display device according to claim 1,
wherein an identical data signal is supplied to the first subpixel and the second subpixel from a common pixel circuit.

* * * * *